United States Patent [19]

Holcomb

[11] Patent Number: 4,817,266
[45] Date of Patent: Apr. 4, 1989

[54] VARIABLE AXIAL LEAD ELECTRICAL COMPONENT FEEDER

[76] Inventor: Gregory W. Holcomb, 13 Viento, Irvine, Calif. 92714

[21] Appl. No.: 78,290

[22] Filed: Jul. 27, 1987

[51] Int. Cl.$^4$ .............................................. B23P 23/00
[52] U.S. Cl. .................................... 29/566.3; 29/741; 140/105
[58] Field of Search .................. 29/566.3, 566.2, 566.1, 29/564.7, 33 M, 747, 564.6, 564.8; 140/147, 139, 140, 105; 72/335, 294

[56] References Cited

U.S. PATENT DOCUMENTS

| | | | |
|---|---|---|---|
| 2,978,707 | 4/1961 | Runciman | 29/741 X |
| 3,577,847 | 5/1971 | Scranton | 29/566.1 X |
| 3,769,823 | 11/1973 | Greeninger | 72/335 X |
| 4,072,177 | 2/1978 | Daebler | 140/105 |
| 4,567,653 | 2/1986 | Heller et al. | 140/105 X |
| 4,633,584 | 1/1987 | Wright et al. | 29/741 |
| 4,635,341 | 1/1987 | Staudinger | 29/566.3 |
| 4,644,633 | 2/1987 | Jones et al. | 29/566.3 |
| 4,711,015 | 12/1987 | Tega et al. | 29/566.2 |

FOREIGN PATENT DOCUMENTS

869088 10/1981 U.S.S.R. .............................. 29/566.3

Primary Examiner—William Briggs
Attorney, Agent, or Firm—Roberts and Quiogue

[57] ABSTRACT

A component lead cutting and forming apparatus for axial lead electronic components respectively having first and second leads secured to tape, including bending dies for supporting the first and second leads of an axial lead component in process. The bending dies are supported by slide blocks, and strain relief clamps selectively clamp the first and second leads against the bending dies. First and second parallel carriage blocks, which are adjustable in separation, support the slide blocks. Driving apparatus including an air cylinder translates the slide blocks between a first position and a second position in a linear direction generally orthogonal to the orientation of the axial leads of the component in process, and further controls cutting blades for cutting the leads of the component in process. The cutting blades are secured in parallel cutting blade support blocks which are adjustable as to separation. Bending rollers supported by the carriage blocks cooperate with the bending dies to bend the leads of the axial lead component in process as the slide blocks are linearly translated from the first position to the second position. When the slide blocks are in the second position, grippers grasp the processed component legs and translate the component for robotic pick-up presentation.

15 Claims, 5 Drawing Sheets

FIG.19

VARIABLE AXIAL LEAD ELECTRICAL COMPONENT FEEDER

BACKGROUND OF THE INVENTION

The disclosed invention generally relates to apparatus for cutting and forming the leads of taped electrical components, and is more particularly directed to apparatus for cutting and forming the leads of taped components having axial leads.

For utilization in the fabrication of electrical circuits, electronic components such as resistors, capacitors, and diodes are provided by component manufacturers with their leads secured to an elongated tape. A particular type of component configuration, generally known as axial lead components, have leads which emerge from generally opposite sides of the component. Taped axial lead components are generally taped on both leads.

For utilization, taped axial lead electronic components are separated from the tape by cutting the leads and appropriately forming the cut leads for insertion. The cutting and forming has generally been performed with different types of machinery.

However, known apparatus for cutting and forming axial lead taped components which are adjustable to accommodate different components on the same tape (sequence tape) are not adaptable for use with robotic assembly systems since such apparatus are stand-alone stations which also insert the processed components into circuit boards and the processed components cannot be properly presented for robotic pick-up. Moreover, such stand-alone stations utilize a large amount of space.

SUMMARY OF THE INVENTION

It would therefore be an advantage to provide a cut and form apparatus for cutting and forming the leads of axial lead taped electronic components which accommodates a range of body and lead sizes and readily adjusts to accommodate various tape widths and pitches and is readily utilized with robotic assembly systems.

It would also be an advantage to provide a cut and form apparatus for cutting and forming the leads of axial lead taped electronic components which adjusts to form a wide range of bend widths and leg lengths on the same or different components on the same tape and is readily utilized with robotic assembly systems.

Another advantage would be to provide a cut and form apparatus for cutting and forming the leads of axial lead taped electronic components which provides for computer controllable bend widths and leg lengths and is readily utilized with robotic assembly systems.

The foregoing and other advantages are provided by a component lead cutting and forming apparatus which includes first and second supporting apparatus adjustably separated from each other for supporting the first and second leads of an axial lead component in process. Strain relief clamps cooperate with the supporting apparatus to strain relief clamp the leads of the axial lead component in process. First and second cutting assemblies adjustably separated from each other cut the leads of the component in process, the separation between the first and second cutting means being adjustable independently of adjustment of the separation between the first and second supporting apparatus. Bending rollers cooperate with the first and second supporting apparatus to bend the leads of the component in process when the first and second supporting apparatus and the bending rollers move relative to each other. Driving apparatus is provided for causing linear relative translation between (a) the first and second supporting apparatus and (b) the bending rollers in a direction generally orthogonal to the leads of the component in process to effect the bending of the leads of the component in process.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

In the following detailed description and in the several figures of the drawing, like elements are identified with like reference numerals.

Overview

The disclosed lead cutting and forming apparatus generally includes structures for supporting and clamping the axial leads of the axial lead electronic component in process. The leads of the component in process are cut to predetermined lengths, and the supporting and clamping structures are translated to transport the component in a linear direction that is generally orthogonal to the axial leads. As the component is transported, the cut leads are bent as they engage bending rollers. The processed component having cut and formed leads is unclamped and transported away from the supporting and clamping structures and presented for robotic pick-up.

The disclosed lead cutting and forming apparatus includes an adjustable carriage assembly for supporting the supporting and clamping structures and the bending rollers so that the bend width may be adjusted. Further, the cutting apparatus is also adjustable, independently of the adjustable carriage assembly, to allow for adjustment of the location of the lead cuts. Thus, leg length and bend width, collectively referred to as lead parameters, can be precisely adjusted. Only one component is in process at any given time, and such adjustment may be individually performed for each component in process, and may be performed automatically or manually. The disclosed lead cutting and forming apparatus is therefore readily adjusted for different components and different lead parameters, and moreover is capable of processing a component tape having different components or components requiring different lead parameters.

Specific Embodiment Details

Figure 1:
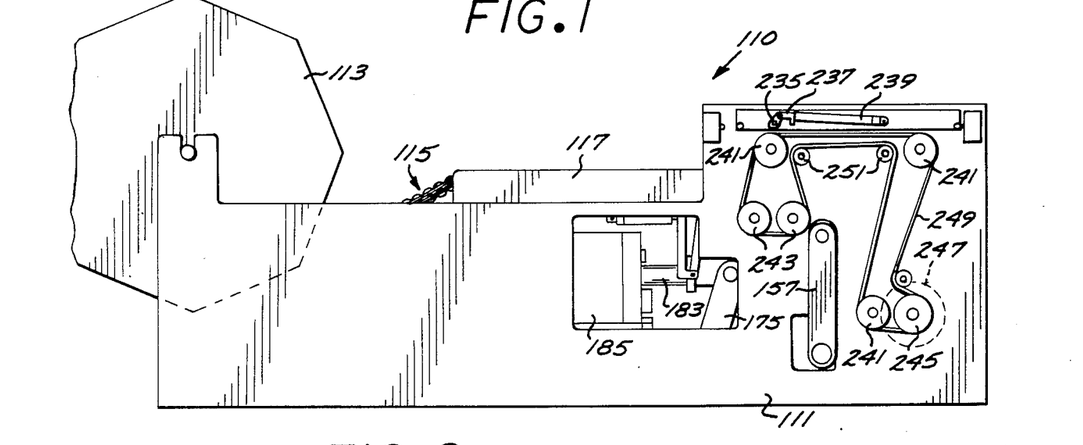
FIG. 1 is an elevational view of the taped component lead cut and form apparatus of the invention.
Figure 2:
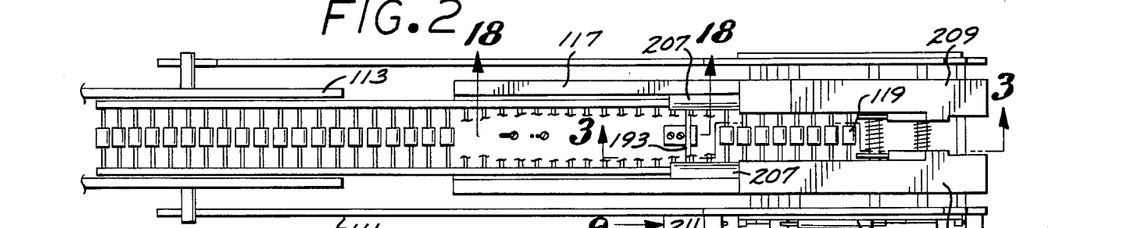
FIG. 2 is a top plan view of the taped component lead cut and form apparatus of FIG. 1.
Figure 3:
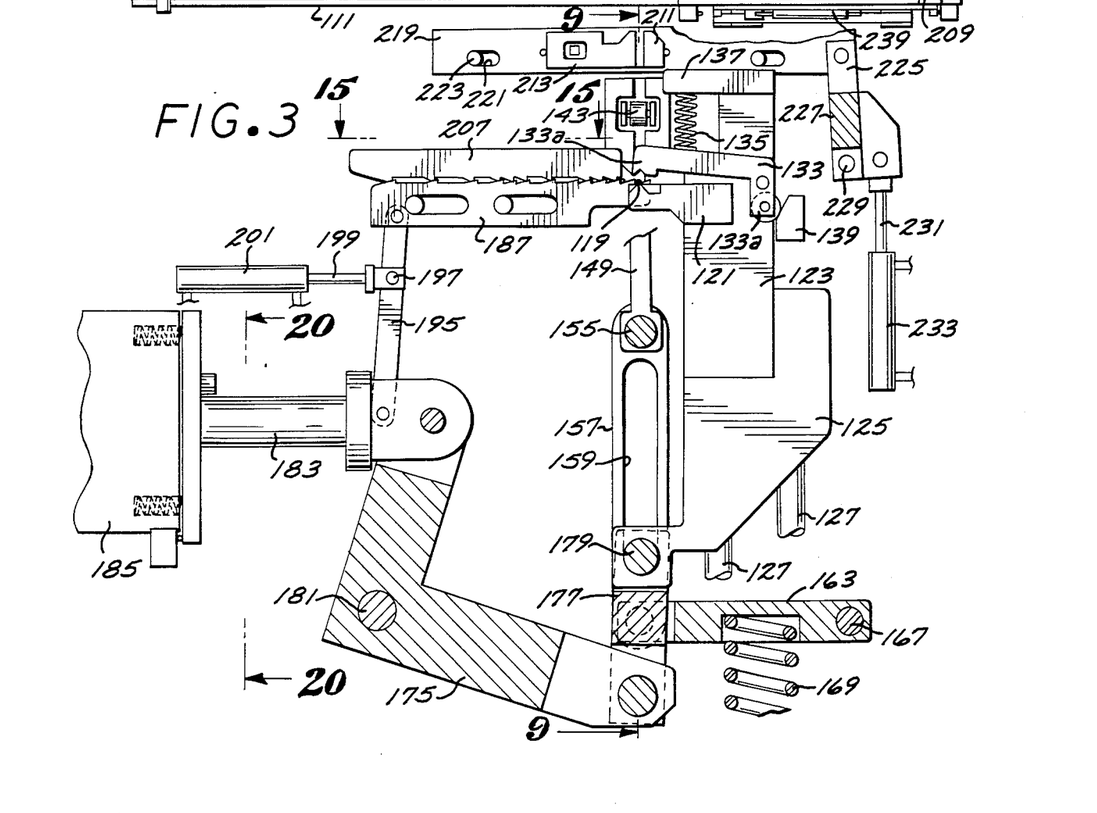
FIG. 3 is a sectional view of the taped component lead cut and form apparatus of the invention taking along the section lines 3 in FIG. 2.

Referring now to FIGS. 1-3, the disclosed lead cutting and forming apparatus 110 generally includes support frame 111 which accommodates a taped component reel 113 at one end. The reel 113 stores a tape of axial lead components generally identified as 115. The component tape 115 is fed along tape guide rails 117 by a ratchet feeder mechanism to be described more fully herein. The component in process, identified with the reference numeral 119, is fed onto parallel internal bending dies 121, one for each of the axial leads. The bending dies are secured to parallel plates 123 which in turn are respectively secured to parallel sliding blocks 125. For ease of reference, the general region on the bending dies 121 where the component in process 119 is located shall sometimes be referred to as the processing station.

Figures 22, 23, 24, 25, 26:
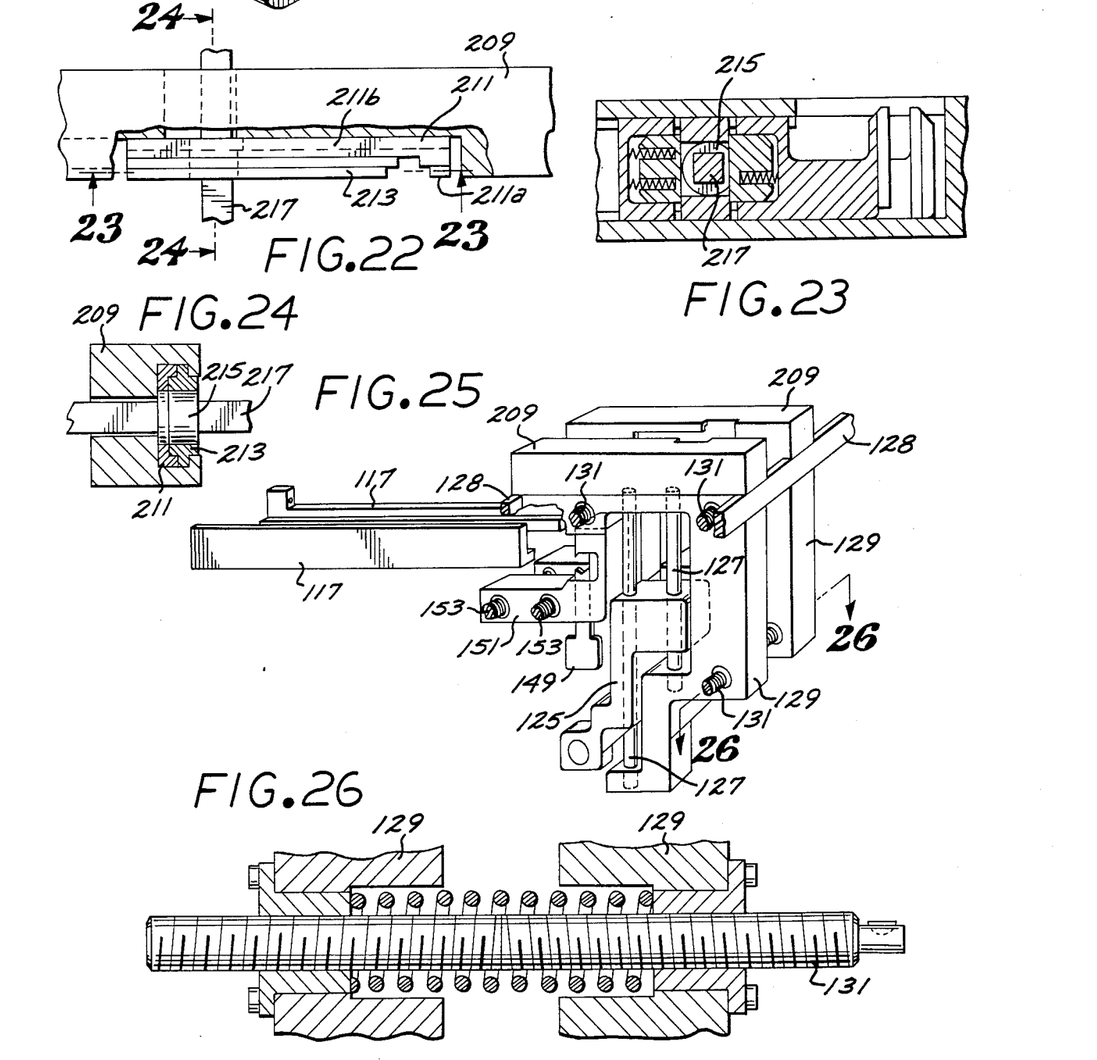
FIG. 22 is a cutaway top view showing a gripper mechanism of the taped component lead cut and form apparatus of the invention.
FIG. 23 is a sectional view taken along the section lines 23 in FIG. 22.
FIG. 24 is a sectional view taken along the section lines 24 in FIG. 22.
FIG. 25 is a schematic perspective view of certain major components of the taped component lead cut and form apparatus of the invention.
FIG. 26 is a sectional view illustrating one of the threaded adjustment rods used for adjusting the spacing between certain carriage blocks of the taped component lead cut and form apparatus of the invention.

The sliding blocks 125 are slidably engaged in respective pairs of vertical guide shafts 127 and are actuated for linear translation along such guide shafts 127. As shown in FIG. 24, the guide shafts 127 for respective slide blocks 125 are secured in respective parallel carriage blocks 129. The carriage blocks 129 are secured to the support frame 111 by three threaded rods 131. Each half of the threaded rods 131 includes threads of opposite sense so that rotation of the rods 131 allows adjustment of the separation between the carriage blocks 129. As discussed more fully herein, the separation between the carriage blocks 129 determines the location of the bends on the axial leads of the component in process. Additional support structure may be provided for the carriage blocks 129, for example by slide braces 128 secured between the sides of the support frame 111.

Figure 20:
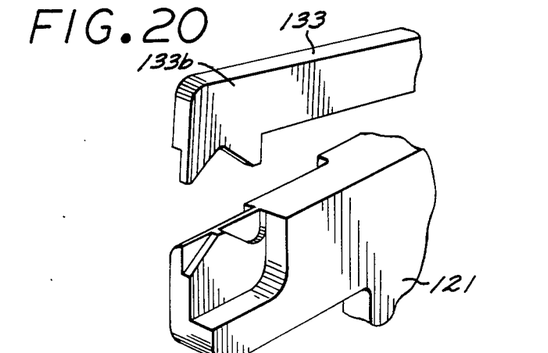
FIG. 20 is a detailed view of a lead bending die and a mating strain relief clamp member utilized in the taped component lead cut and form apparatus of the invention.
Figure 21:
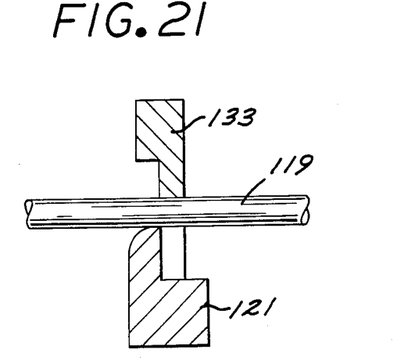
FIG. 21 is a sectional view of the bending die and clamping member shown in FIG. 20.

Further secured to the parallel plates 123 are pivoted parallel strain relief clamps 133, each including a notched clamping end 133a. The notched clamping ends 133a function to clamp the axial leads of the component in process 119 against the parallel bending dies 121 and provide for strain relief. As shown more particularly in FIG. 20, a bending die 121 and its associated strain relief clamping end 133a include complementary cutouts to provide for proper location of the component lead.

The parallel strain relief clamps 133 further include cam following rollers 133b at their other ends. The parallel strain relief clamps 133 are biased toward the parallel bending dies 121 by respective coil springs 135 which are secured to respective arms 137 of the parallel plates 123. As shown in FIGS. 3-7, lower cams 139 and upper cams 141 (FIG. 4) are secured to the carriage blocks 129 and when engaged by the cam following rollers 133b function to open the parallel strain relief clamps 133 against the coil springs 135 when the slide blocks 125, and therefore the parallel plates 123, are at lower and upper locations of their linear translation range.

Figures 9, 10, 11, 12:
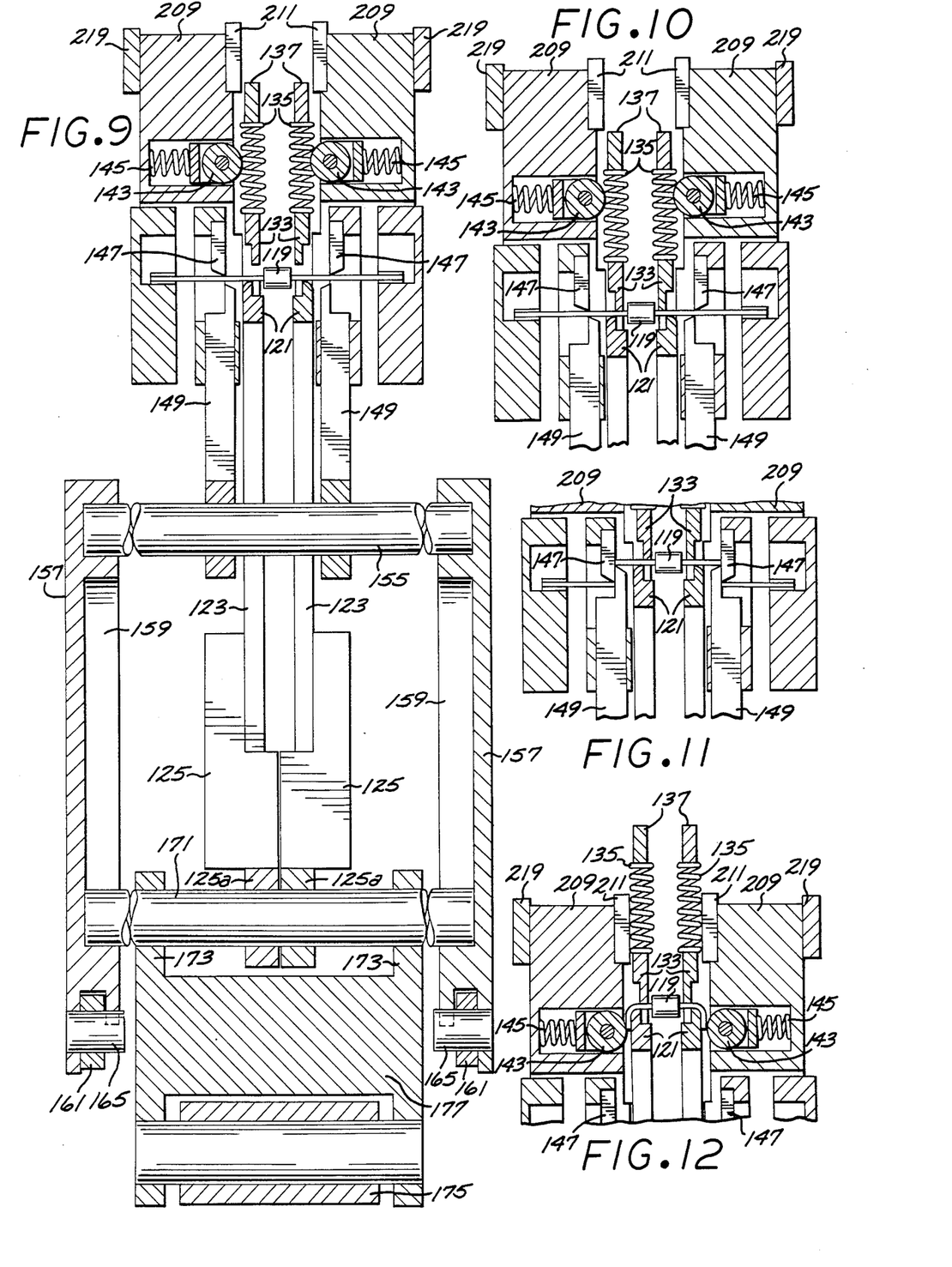
FIG. 9 is a partial sectional view further illustrating the lead cutting elements and the driving elements of the taped component lead cut and form apparatus of the invention.
FIGS. 10 through 14 are further illustrations of various stages in the processing provided by the taped component lead cut and form apparatus of the invention.
Figures 13, 14, 15, 16:
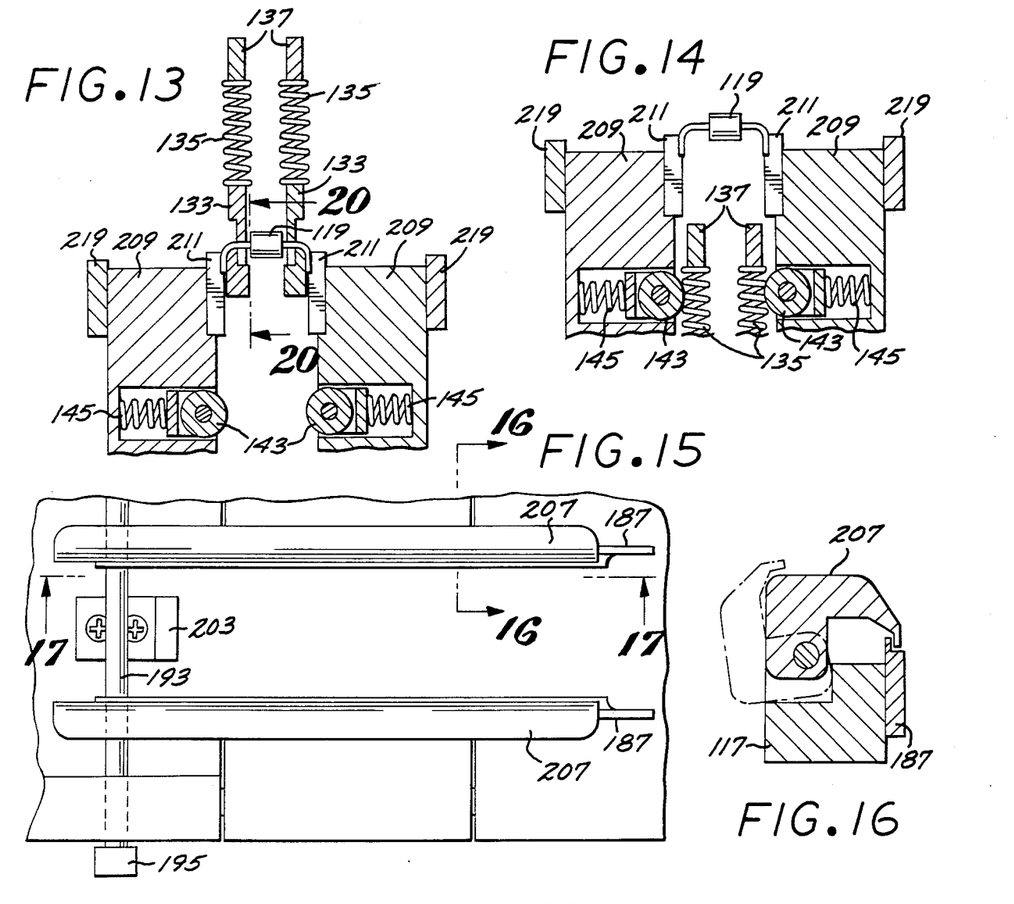
FIG. 15 is a top plan view of the feeding apparatus of the taped component lead cut and form apparatus of the invention.
FIG. 16 is a sectional view taken along the section lines 16 in FIG. 15.
Figures 17, 18:
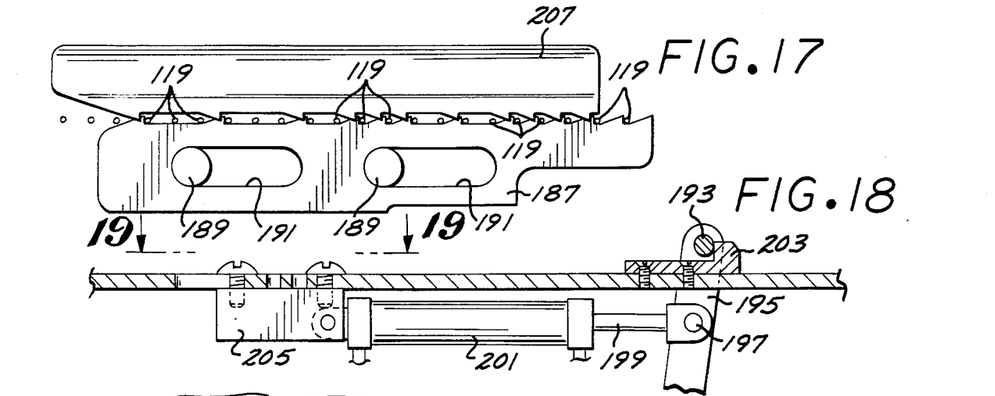
FIG. 17 is an elevational view taken along the view lines 17 in FIG. 15.
FIG. 18 is a partial cross sectional view taken along the section lines 18 in FIG. 2.
Figure 19:
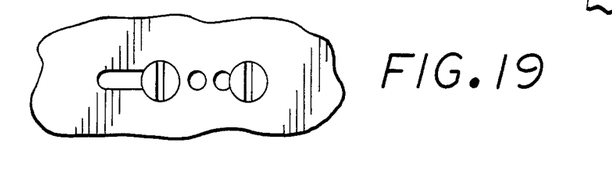
FIG. 19 is a partial top plan view taken along the view lines 19 in FIG. 18.

Referring more particularly to FIG. 9, further secured in the carriage blocks 129 are respective bending rollers 143 which are rotatable about axes generally orthogonal to the axial leads of the component in process 119 and also to the translation direction of the slide blocks 125. The rollers 143 are appropriately secured in ways which are compressively biased by respective springs 145. In use, as shown in FIGS. 10-12, when the component in process 119 is transported (after the leads have been cut) by the translation of the parallel plates 123, the cut axial leads of the component in process 119 engage the bending rollers 143 which cause the leads to bend and conform to the outside surfaces of the parallel bending dies 121.

Cutting of the leads of the axial component in process 119 is provided by parallel stationary cutting blades 147 and parallel moving cutting blades 149 respectively cooperating therewith. The stationary cutting blades 147 are fixedly secured to respective parallel cutting blade support blocks 151, while the moving cutting blades 149 are slidably engaged in the cutting blade support blocks 151. As shown in FIG. 24, the cutting blade support blocks 151 are secured to the support frame 111 by two threaded rods 153. Each half of the threaded rods 153 includes threads of opposite sense so that rotation of the rods 153 allows adjustment of the separation between the cutting element support blocks 151. The separation between the cutting blade support blocks 151 determines the locations of the lead cuts. Thus, adjustment of cutting blade support blocks 151 relative to the adjustment of the carriage blocks 129 determines the length of the lead legs of the processed axial lead component.

Figures 4, 5, 6, 7, 8:
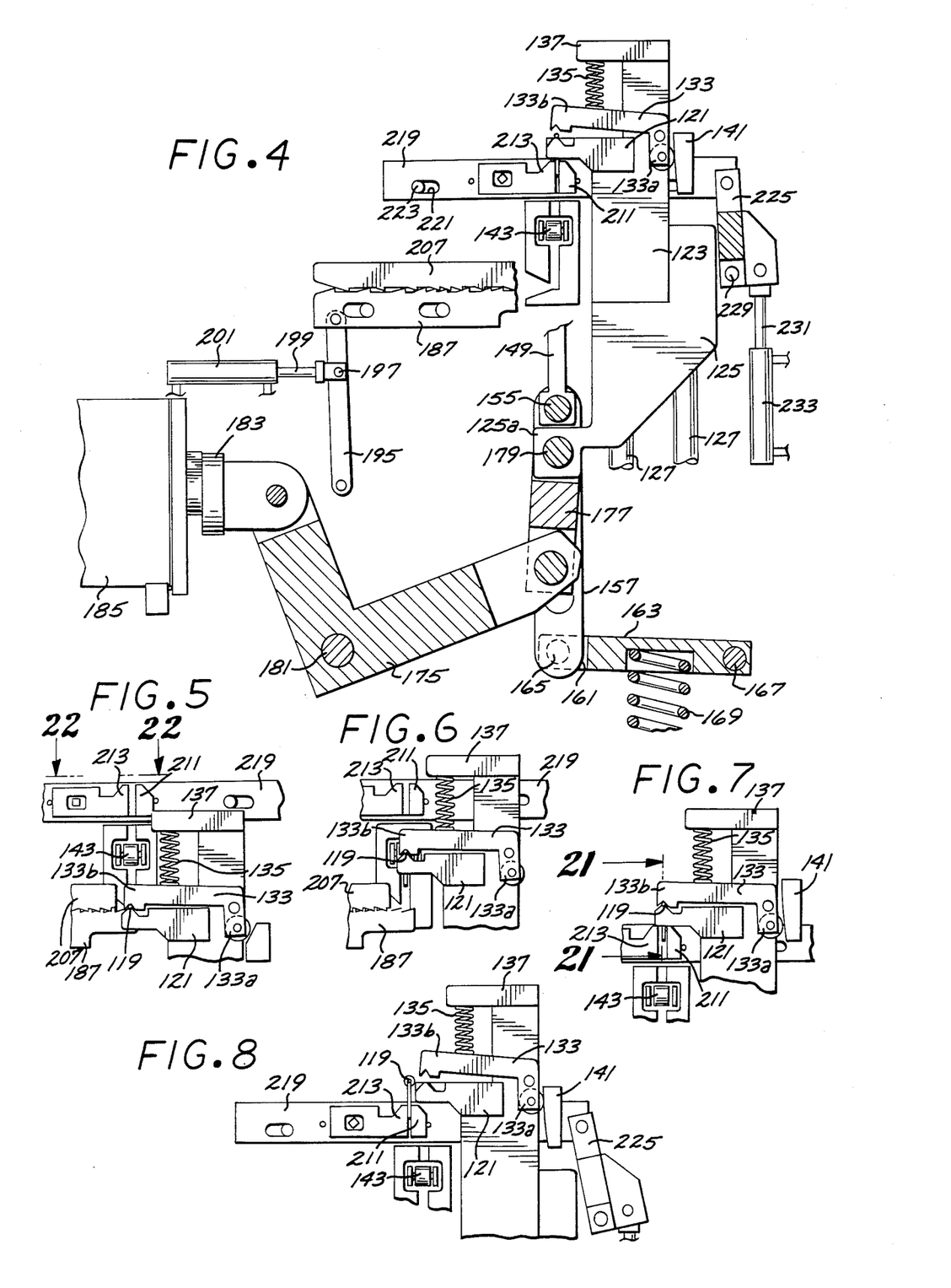
FIG. 4 is a sectional view similar to FIG. 3 showing the taped component lead cut and form apparatus of the invention in a different stage of processing.
FIGS. 5 through 8 illustrate various stages in the processing of an axial lead component.

Referring now to FIG. 9 and FIGS. 3 and 4, the moving cutting blades 149 are slidably engaged on a wrist pin 155 which has its ends secured in the ends of respective parallel connecting arms 157. Each of the parallel connecting arms 157 includes an inside channel 159. The other ends of the connecting arms 157 are rotatably coupled to the arms 161 of a spring retainer 163 by pins 165. The other end of the spring retainer 163 is rotatably secured to a fixed pin 167. A coil spring 169 is compressively biased against the bottom of the spring retainer 163. Absent any opposing force, the coil spring 169 causes the moving cutting blades 149 to engage the stationary cutting blades 147.

A moving shaft 171 is slidably engaged in the channels 159 of the connecting arms 157, and is rotatably engaged in the arms 173 of a connecting link 177. The shaft 171 is further coupled to the eyelets 125a of the slide blocks 125 with a pin 179. A bell crank 175 is axially secured to a fixed pin 181, and has one end coupled to the lower end of the link 177. The other end of the bell crank 175 is coupled to the actuating rod 183 of an air cylinder 185. Retraction of the actuating rod 183 causes the slide blocks 125 to translate upwardly (shown in FIG. 4), with the moving shaft 171 travelling in the channels 159. Extension of the actuating rod 183 causes the slide blocks to translate downwardly (shown in FIG. 3). The bell crank 175, the channels 159 in the connecting arms 157, and the spring retainer 163 are configured to allow the moving shaft 171 to engage the lower ends of the channels 159 in the connecting arms 157 as the air cylinder actuating rod 183 reaches its most extended position. The connecting arms 157 are thereby pulled down, separating the moving cutting blades 149 from the stationary cutting blades 147 and also compressing the coil spring 169 as shown in FIG. 3.

Referring to FIGS. 15-19 and FIG. 3, illustrated therein is a reciprocating ratchet mechanism that is utilized to feed the taped components into the cut and form apparatus 110. The ratchet mechanism includes lower parallel moving slides 187 which are slidably mounted to the respective inside portions of the tape guide rails 117 via shoulder screws 189 which are located in elongated slots 191 in the moving slides 187. The moving slides 187 include ramped teeth which ramp in the direction of the intended travel of the taped components. A rod 193 is connected between the moving slides 187. The ends of the rod 193 are connected to the upper ends of parallel connecting arms 195 which have their lower ends rotatably connected to a fixed location. A rod 197 is secured between the connecting arms 195, and the actuating arm 199 of an air cylinder 201 is connected thereto. Extension of the actuating arm 199 causes the moving ratchet slides 187 to move toward the processing station (FIG. 3), while retraction of the actuating arm 199 causes the moving ratchet slides to move away from the processing station (FIG. 4).

A mechanical stop 203 limits the displacement of the moving ratchet slides 187 toward the processing station by engaging the rod 193. The amount of displacement of the moving ratchet slides 187 away from the processing station is controlled by adjusting the location of the air cylinder mounting bracket 205.

The ratcheting mechanism further includes parallel hinged stationary ratchets 207 which are hingedly attached to the tape guide rails 117 to rotate about parallel axes that are generally parallel to the direction of the taped component travel. The hinged stationary ratchet slides 207 include downward facing ramped teeth which are adjacent and offset to the inside of the ramped teeth of the moving ratchet slides 187 when the hinged slides are in the down position. The hinged stationary ratchets 207 include ramped teeth which ramp in the direction of the intended travel of the taped components.

In the open position, the hinged slides 207 are to the sides of the guide rails 117, which allows for placement of the component tape within the tape guide rails 117 with certain axial leads engaged in the ramped teeth of the parallel moving ratchet slides 187.

In use, the hinged ratchets 207 are in the closed position. The teeth of the moving slides 187 engage leads of certain axial lead components and feed the component tape 115 pursuant to the extension of the actuating rod 199 of the air cylinder 201. Retraction of the actuating rod 199 causes the moving slides 187 to slide under the axial leads as a result of the ramped teeth. The stationary ratchets 207 prevent the rearward movement of the component tape, and further function to maintain the axial leads engaged in the ramped teeth of the moving slides 187 as the moving slides move toward the processing station.

The upper portions of the carriage blocks 129 engage two adjustment threaded rods 131 and secure the slider block guide shafts 127. Further, horizontal gripper blocks 209 are secured to the tops of the carriage blocks 129, and parallel gripper assemblies are secured in respective channels on the inside of the horizontal gripper blocks 209. The parallel gripper assemblies include L-shaped parallel stationary gripper elements 211 which include gripper jaws 211a and elongated sections 211b. Moving gripper jaws 213 are slidably engaged against the elongated sections 211b of the stationary gripper elements 211, and are movable relative to the stationary gripper 211. The stationary gripper jaws 211a and the moving gripper jaws 213 thus cooperate to provide a gripping action. The moving gripper jaws 213 are controlled to move toward and away from the stationary gripper jaws 211a by a cam 215 which is engaged by a rod 217 having a square cross section.

The parallel stationary gripper elements 211 are fixedly secured by the square rod 217 to parallel slides 219 which are separated from and on the outside of the horizontal gripper blocks 209. The square rod 217 is rotatably secured to the parallel slides 219 which include elongated slots 221 that engage pins 223 secured in the support frame 111, which allow the parallel slides 219 to be linearly displaced back and forth. The square rod 217 passes through elongated slots in the horizontal gripper blocks 209.

Ends of the parallel slides 219 are coupled to the arms 225 of a yoke 227 which is pivotally secured with a rod 229. The actuating rod 231 of an air cylinder 233 is coupled to the yoke 227 to cause the yoke to pivot about the rod 229. Extension of the actuating rod 231 causes the slides 219 to move to the left, as viewed in FIG. 3, while retraction of the actuating rod 231 causes the slides 219 to move to the right.

The square cross sectioned rod 217 is coupled via a lever 235 to the actuating arm 237 of an air cylinder 239 (FIG. 1). The air cylinder is mounted on one of the parallel slides 219.

The gripper assemblies including the stationary gripper elements 211, the moving gripper jaws 213, the rod 217, and the air cylinder 239 all move with the parallel slides 219 as controlled by the air cylinder 233. The moving jaws 213 are controlled independently of the displacement of the parallel slides 219.

The gripper assemblies are configured so that the legs of the processed component 119 are located between the stationary gripper jaws 211a and the open moving gripper jaws 213 when the slide blocks 125 reach the top of their displacement range. At such position, the clamping ends 133a of the parallel strain relief clamps 133 are positioned away from the bending dies 121. The air cylinder 239 is then actuated to move the moving gripper jaws 213 toward the stationary gripper jaws 211a to grip the component legs. The air cylinder 233 is then actuated to move the slides 219 toward the left, as shown in FIG. 8. This moves the processed component 119 away from the bending die 121 and the clamp 133, and the component is ready for robotic pick-up.

The overall operation of the axial lead cut and form apparatus is as follows. The actuating rod 183 of the air cylinder 185 is fully extended; and the slide blocks 125 are at their lowest position, the strain relief clamps 133 are open, the moving cutting blades 149 are separated from the stationary cutting blades 147, and the coil spring 169 is compressed. The actuating rod 199 of the air cylinder 201 is extended to move the ratchet slides 187 toward the processing station, whereby the axial leads of a component are located on the bending dies 121. Preferably, parallel notch like openings are provided in the carriage blocks 129 adjacent the bending dies 121 for guiding the axial component leads onto the indented portions of the bending dies 121.

The actuating rod 183 of the air cylinder 185 is then retracted; and the coil spring 169 extends causing the moving cutting blades 149 to engage the stationary cutting blades, whereby the leads of the component in process are cut. The clamping members close as the slide blocks 125 are translated upwardly. The clamped leads engage the bending rollers 143 and are bent as the slide blocks continue their upward translation. As the slide blocks reach their upper range of translation, the clamping members 133 open.

The air cylinder 239 is then actuated to move the moving gripper jaws 213 toward the stationary gripper jaws 211a. After the lead legs are gripped, the actuating rod 231 of the air cylinder 233 is extended to carry the processed component away from the bending dies 121, the processed component is ready for robotic pick-up.

As discussed above, separation between the carriage blocks 129 is adjustable via the threaded rods 131, and the separation between the cutting blade support blocks 151 is adjustable via the threaded rods 153. Such as adjustments can performed manually or under machine control. By way of example, as illustrated in FIG. 1, toothed pulleys 241 are coupled to respective ends of the threaded rods 131, and toothed pulleys 243 are coupled to respective ends of the threaded rods 153. A toothed pulley 245 is coupled to a stepper motor 247, and a toothed belt 249 is engaged in the pulleys and is further supported by appropriate idler wheels or pulleys 251. With such arrangement, the carriage block spacing (location of the bends and thus bend width) and the cutting blade support block spacing (length of lead legs) are adjusted together. Alternatively, the respective spacing can be adjusted independently with individual stepper motors. For manual adjustment, similar toothed belt mechanisms with appropriate adjustment knobs can be utilized.

The foregoing has been a disclosure of an axial lead cut and form apparatus which provides several advantages in the processing taped axial lead electronic components for presentation for robotic pick-up. It accommodates a range of body and lead sizes and readily adjusts to accommodate various tape widths and pitches. Such apparatus further adjusts to form a wide range of bend widths and leg lengths on the same or different components on the same tape. Also, the disclosed apparatus provides for computer controllable bend widths and leg lengths Although the foregoing has been a description and illustration of specific embodiments of the invention, various modifications and changes thereto can be made by persons skilled in the art without departing from the scope and spirit of the invention as defined by the following claims.

What is claimed is:

1. A component lead cutting and forming apparatus for axial lead electronic components respectively having first and second leads secured to tape, comprising:
   first and second supporting means adjustably separated from each other for supporting the leads of an axial lead component in process;
   means for adjusting the separation between said first and second supporting means without disassembly of said first and second supporting means;
   means for strain relief clamping the leads of the axial lead component in process;
   first and second cutting means adjustably separated from each other for cutting the leads of the component in process, the separation between said first and second cutting means being adjustable independently of the adjustment of the separation between said first and second supporting means;
   means for adjusting the separation between said first and second cutting means without disassembly of said first and second cutting means independently of the adjustment of the separation between said first and second supporting means;
   means for controlling said first and second means to cut the first and second leads of the axial lead component in process;
   bending means for cooperating with said first and second supporting means to bend the leads of the component in process when said first and second supporting means and said bending means move relative to each other; and
   driving means for providing linear relative translation between (a) said first and second supporting means and (b) said bending means in a direction generally orthogonal to the leads of the component in process to effect bending of the leads of the component in process.

2. The component lead cutting and forming apparatus of claim 1 wherein said first and second supporting means includes first and second bending dies.

3. The component lead cutting and forming apparatus of claim 2 wherein said bending means includes first and second bending rollers adjustably separated from to each other, the separation between said rollers being controlled by the separation between said first and second supporting means.

4. The component lead cutting and forming apparatus of claim 3 wherein said strain relief clamping means includes first and second clamping members for clamping the axial component leads against the bending dies.

5. The component lead cutting and forming apparatus of claim 4 wherein said first cutting means includes a first stationary cutting blade secured to a first cutting blade support block and a first movable cutting blade slidably engaged in said first cutting blade support block and engageable with said first stationary cutting blade, and wherein said second cutting means includes a second stationary cutting blade secured to a second cutting blade support block and a second cutting blade support block and engageable with said second stationary cutting blade.

6. A component lead cutting and forming apparatus for axial lead electronic components respectively having first and second leads secured to tape, comprising:
- first and second support means for respectively supporting the first and second leads of an axial lead component in process, said first and second support means adapted for linear translation;
- first and second means respectively secured to said first and second support means for selectively clamping the first and second leads;
- first and second parallel carriage blocks for supporting said first and second support means and said first and second clamping means, the separation between said carriage blocks being adjustable;
- means for adjusting the separation between said first and second parallel carriage blocks without disassembly of said first and second support means and said first and second clamping means;
- first and second cutting means for cutting the first and second leads of the axial lead component in process;
- driving means for controlling said first and second cutting means to cut the first and second leads of the axial lead component in process and for translating said first and second support means between a first position and a second position in a linear direction generally orthogonal to the orientation of the axial leads of the component in process;
- first and second bending means supported by said carriage blocks for cooperating with said support means to bend the first and second leads of the axial lead component in process as said first and second support means are linearly translated from said first position to said second position;
- means for controlling said first and second clamping means to be unclamped in said first and second positions of said support means; and
- means for gripping the component when said first and second support means are in said second position and for presenting the processed component for robotic pick-up.

7. The component lead cutting and forming apparatus of claim 6 wherein said first and second support means comprises:
- first and second slide blocks slidably engaged in said first and second carriage blocks;
- first and second parallel plates secured to said first and second slide blocks; and
- first and second parallel bending dies secured to said first and second parallel plates.

8. The component lead cutting and forming apparatus of claim 7 wherein first and second clamping means comprises first and second pivoted clamping levers having clamping ends for clamping the axial leads of the component in process against the first and second parallel bending dies.

9. The component lead cutting and forming apparatus of claim 8 wherein said controlling means comprises:
- first and second rollers rotatably secured to said first and second pivoted clamping levers; and
- cams for engaging said first and second rollers when said first and second slide blocks are in said first and second positions.

10. The component lead cutting and forming apparatus of claim 7 wherein said first and second bending means comprises means for engaging the axial leads of the component in process and bending the axial leads against said first and second bending dies as the component in process is translated.

11. The component lead cutting and forming apparatus of claim 10 wherein said means for engaging the axial leads includes bending rollers.

12. The component lead cutting and forming apparatus of claim 6 wherein said cutting means comprises:
- first and second stationary cutting elements;
- first and second moving cutting elements for cooperating with said first and second stationary cutting elements;
- first and second parallel support blocks for supporting said first and second stationary cutting elements and said first and second moving cutting elements, the separation between said first and second support blocks being adjustable; and
- means for biasing said first and second moving cutting elements for engagement with said first and second stationary cutting elements.

13. The component lead cutting and forming apparatus of claim 12 wherein said biasing means includes a pivoted lever, a coil spring biased against said coil spring, and connecting arms connected between said pivoted lever and said first and second moving cutting means.

14. The component lead cutting and forming apparatus of claim 13 wherein said driving means comprises:
- actuating means coupled to said first and second support means for driving said first and second support means between said first position and said second position; and
- means coupled to said actuating means for engaging said connecting arms to compress said coil spring when said first and second support means are in said first position.

15. The component lead cutting and forming apparatus of claim 14 wherein said connecting arms include respective channels and wherein said engaging means includes means for engaging said channels.

* * * * *